United States Patent [19]

McKie et al.

[11] 4,012,786

[45] Mar. 15, 1977

[54] MAGNETIC DATA DECODER

[75] Inventors: Kenneth Thomas McKie, Rolling Hills Estates; Istvan Steve Olah, Los Angeles, both of Calif.

[73] Assignee: TRW Inc., Los Angeles, Calif.

[22] Filed: Feb. 5, 1976

[21] Appl. No.: 655,438

[52] U.S. Cl. .................................. 360/45; 360/43
[51] Int. Cl.² ........................................ G11B 5/02
[58] Field of Search ............................. 360/43, 45; 235/61.11 D

[56] References Cited

UNITED STATES PATENTS

| | | | |
|---|---|---|---|
| 3,711,843 | 1/1973 | Galvagni et al. | 360/43 |
| 3,736,581 | 5/1973 | Brciks | 360/43 |
| 3,947,662 | 3/1976 | Vinzl | 360/43 |

*Primary Examiner*—Vincent P. Canney

[57] ABSTRACT

A data decoder is provided which is useful for decoding data magnetically encoded on a magnetic stripe on the back side of a credit card which may be manually moved through a reader at a variable velocity. The data is decoded by comparing the occurrence of voltage pulses after the onset of a bit interval, representing binary data encoded as magnetic flux changes, with a preselected portion of the measured time duration of the preceding bit interval. If a voltage pulse occurs after the onset but before the end of the preselected portion, the data is determined as a binary "one"; if a voltage pulse occurs after the end of the preselected portion, the data state is determined as a binary "zero".

17 Claims, 7 Drawing Figures

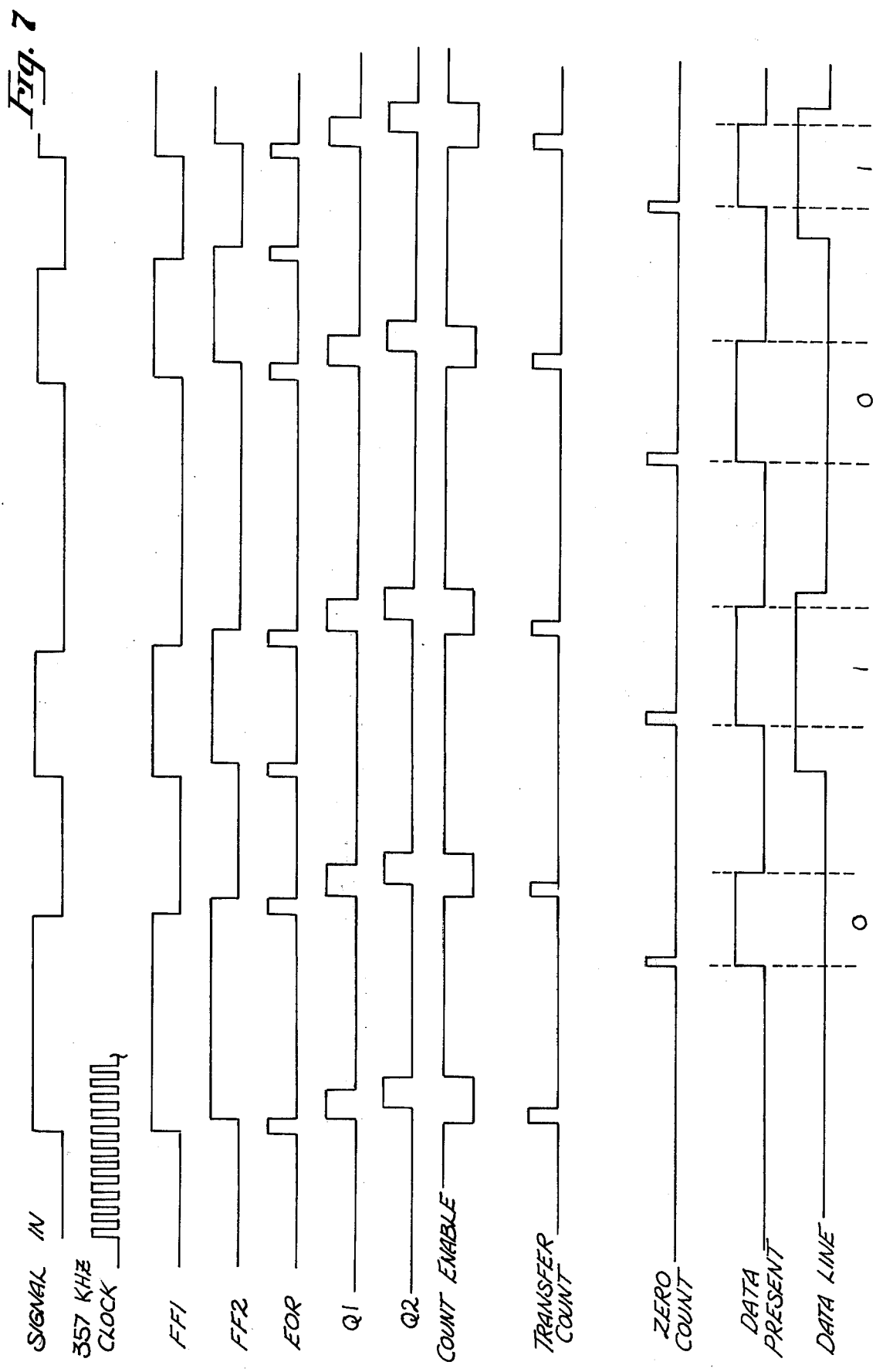

MAGNETIC DATA DECODER

FIELD OF THE INVENTION

This invention relates to the field of data decoding and, in particular, to circuitry for decoding data encoded on a magnetic medium.

PRIOR ART

A standard prior art technique for encoding data on a magnetic medium is to use double frequency phase encoding. Double frequency phase encoding is a system of encoding digital information on a track of magnetic media such that no separate "clock" track is necessary. Information is conveyed by the series of reversals of magnetic flux on the track. Such reversals or flux changes occur at the end of every binary digit (bit) interval on the track. If the digit to be conveyed during the interval is a "zero", there is no flux change until the end of the interval. If the digit to be conveyed during that interval is a "one", there is, however, also a flux change near the center of that interval as well as at the end of the interval. Since these binary digit (bit) intervals are spaced equidistant on the track, a track which contained a string of consecutive "ones" would, when moved over the head, produce flux changes at double the frequency that a string of consecutive "zeros" would produce.

This system of encoding has become standard for magnetic stripes attached to credit cards. The card is encoded such that there are always several leading "zeros" in front of the true information so that the read circuitry has an opportunity to become synchronized with the time interval for a "zero".

The first "one" determines the beginning of the data. The standard prior art technique for decoding data that is encoded on such a magnetic medium in a self-clocking format as double frequency phase encoding was to move the media at a fixed and constant speed across the read head. After the signal was amplified, a fixed time discriminator was employed to extract the digital data. This prior art method of decoding data has, however, the disadvantage of requiring mechanisms which are able to control the velocity of the medium past the read head within a narrow tolerance. These mechanisms, which are generally power driven, are expensive, subject to wear and require continual maintenance. In order to avoid such expensive mechanisms and to be able to read such information at variable speeds, it was necessary to provide a timing circuit synchronized to the data frequency. While this has been done using voltage controlled analog techniques, the circuitry required to do this is quite expensive and subject to error.

Accordingly, it is the general object of the present invention to provide an improved data decoder.

It is another object of the present invention to provide an improved data decoder which can read and interpret digital data encoded on a magnetic stripe which may move over a large range of speeds.

It is a further object of the present invention to provide an improved data decoder which can read and interpret data encoded on a magnetic stripe which may move at a variable speed during the reading of the data thereon.

SUMMARY OF THE INVENTION

A data decoder is provided in which the occurrence of voltage pulses after the onset of a bit time interval, representing binary data encoded as magnetic flux changes on a magnetic medium, are compared with a preselected portion of the measured time duration of the preceeding bit time interval. If a voltage pulse occurs after the onset but before the end of the preselected portion, the data state is determined as a binary "one"; if a voltage pulse occurs after the end of the preselected portion, the data state is determined as a binary "zero".

In a particular embodiment of the invention the time intervals between flux changes as read from a magnetic stripe are measured by employing an oscillator of a fixed higher frequency and two electronic digital counting circuits. The first counter is stepped by a signal of fixed frequency which is many times greater than any expected digital bit frequency from the magnetic stripe. This counter is reset to zero at the beginning of every binary digit (bit) time interval from the magnetic stripe and counts continuously during the time interval until the end of the interval. At the end of the bit time interval the count, which is a direct digital measure of the time of that interval, is transferred to the second counter. The first counter is then reset to zero in preparation for counting and thereby measuring the time for the next binary digit time interval from the stripe.

The second counter begins each binary digit (bit) time interval from the stripe with the count that was generated by the first counter during the preceeding bit time interval. During the bit interval the second counter counts down towards a count of zero at a rate selected to be higher than the rate that the first counter counted upwards. Since the second counter is stepped at a higher rate, it will reach the count of zero within a preselected percent of the bit time interval. If a flux change is detected from the stripe before the second counter reaches a count of zero, the data bit from the magnetic stripe is a "one". If the second counter reaches a count of zero before a flux change is detected, the data bit from the magnetic stripe is a "zero". The flux change subsequent to the time that the second counter reaches the count of zero determines the end of the bit time interval. At that time the new count in the first counter is again transferred to the second counter and the first counter is reset to zero to begin the process for the next bit time interval. The process is repeated bit time interval after bit time interval until all information on the stripe has been read.

The novel features which are believed to be characteristic of the invention, both as to its organization and its method of operation, together with further objects and advantages thereof, will be better understood from the following description in connection with the accompanying drawings in which a presently preferred embodiment of the invention is illustrated by way of example. It is to be expressly understood, however, that the drawings are for purposes of illustration and description only and are not intended as a definition of the limits of the invention.

BRIEF DESCRIPTION OF THE DRAWINGS

FIG. 7 is a timing diagram showing the relationship of the signals in the digital time discriminator of FIG. 7.

DETAILED DESCRIPTION OF THE INVENTION

Figure 1:
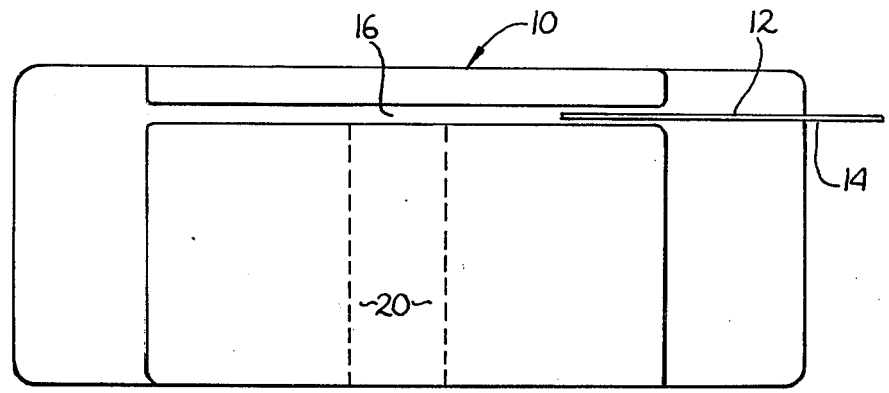
FIG. 1 is a front view of a magnetic stripe reader.
Figure 2:
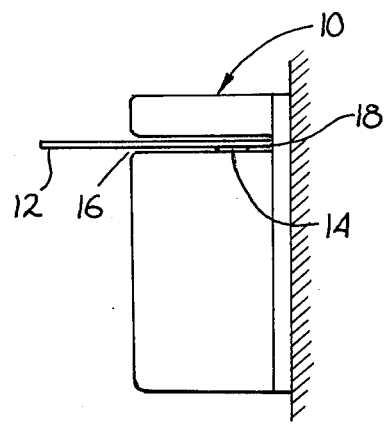
FIG. 2 is a side view of the reader of FIG. 1.

FIGS. 1 and 2 show the front and side view of a magnetic stripe reader 10 that reads the information previously magnetically encoded on a magnetic stripe 12 attached to the back of a typical plastic credit card 14. The operator inserts the card 14 in the slot 16 such that the magnetic stripe 12 faces down and the front of the card 14 faces up. The top edge 18 of the card 14 is pressed parallel to the back of the slot 16. The card 14 is inserted at the right side of a read head 20 as shown in FIGS. 1 and 2, and is then manually slid to the left such that the top edge 18 of the card 14 is guided by the back of the slot 16 to guide the magnetic stripe 12 over the read head 20 to read the information on the magnetic stripe 12.

Figure 3:
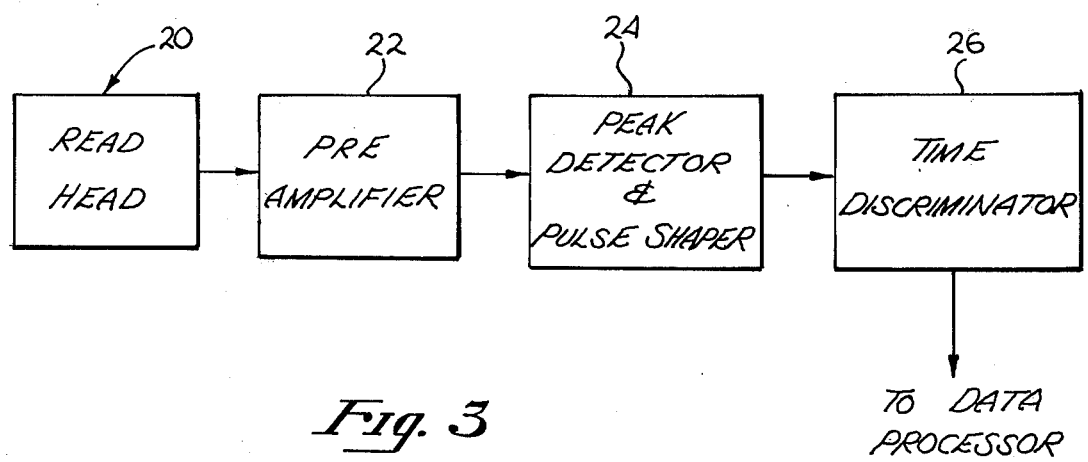
FIG. 3 shows a block diagram of a stripe decoder utilizing the present invention.
Figure 4:
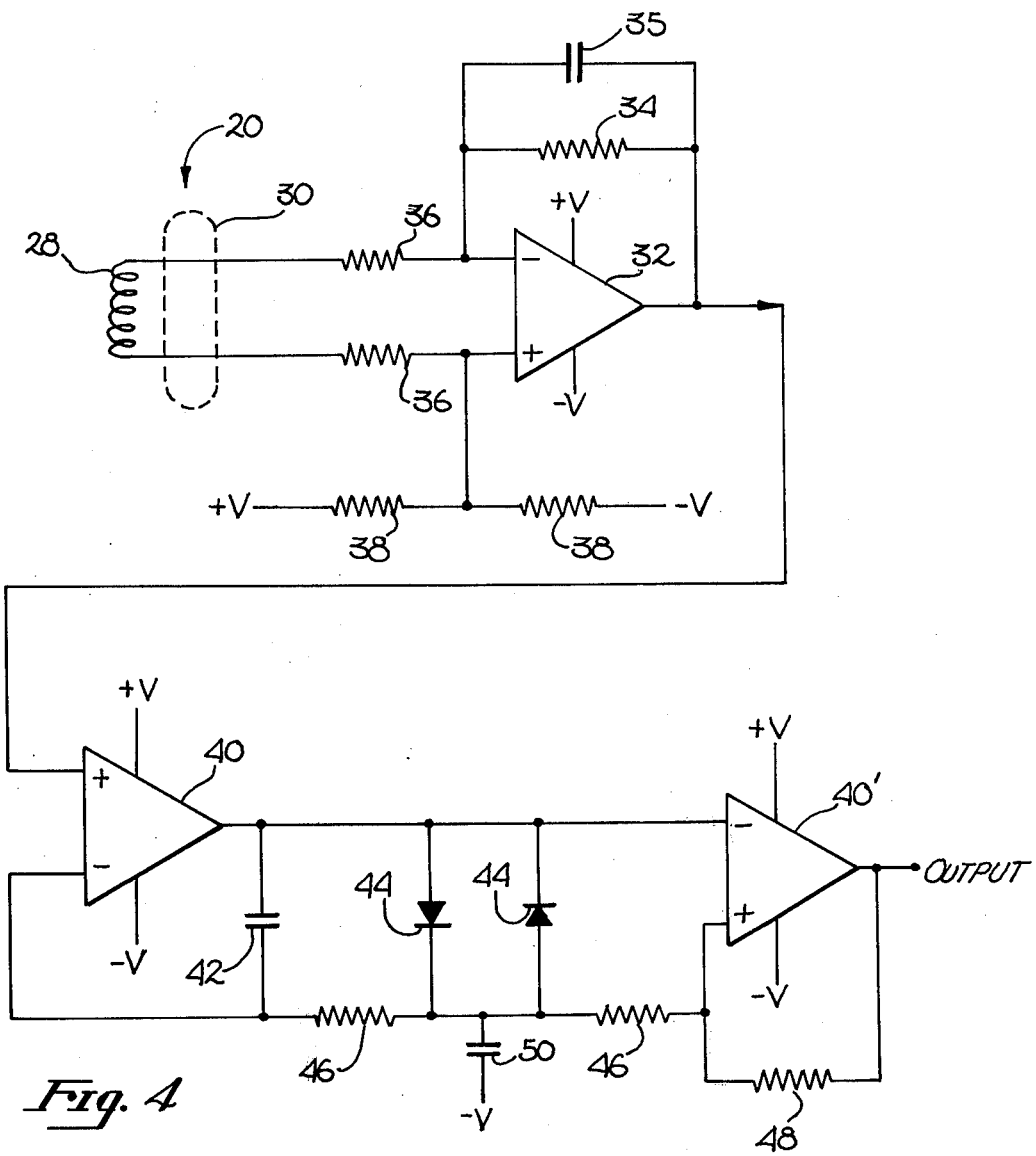
FIG. 4 is a schematic illustration of the read head, preamplifier, peak detector and pulse shaper shown in FIG. 3.

As is shown in FIG. 3, the signal from the magnetic read head 20 is first fed to a preamplifier 22 to increase the voltage and power of the signal and to reduce the influence of stray electrostatic noise. The faster the magnetic stripe is passed over the read head, the larger the voltage of the signal will be since the head measures the rate of change of the magnetic flux on the stripe. In practice the card 14 passes over the read head at a rate which ranges from 0.5 inches/second to 56 inches/second with the information being recorded at 210 bits/inch, and from 1.2 inches/second to 150 inches per second with the information being recorded at 75 bits per inch. Since the information is recorded in a double frequency phase encoding, the signal from the head 20 will generally fall in the range of 200 Hz to 12,500 Hz. The read head 20, as shown in FIG. 4, comprises an induction coil 28 shielded by the grounded shield 30. The preamplifier 22, coupled to the read head 20, comprises an integrated amplifying circuit 32 such as Type 741C manufactured by Texas Instruments, shunted by feedback resistor 34 and capacitor 35. Resistors 36 are part of the input impedance and provide a balanced line for the signal from the read head 20. Resistors 38 establish the D.C. common mode input voltage to the center of the power supply voltage.

As is shown in FIG. 3, the output of the preamplifier 22 is coupled to a peak detecting and pulse shaping circuit 24. Circuit 24, as shown in FIG. 4, comprises a pair of integrated circuit amplifiers 40 and 40', such as Type 1458 manufactured by Texas Instruments, coupled to one another by capacitor 42, diodes 44 and resistors 46. Amplifier 40' is shunted by feedback resistor 48. The circuit is coupled to a voltage source −V through capacitor 50.

Figure 5:
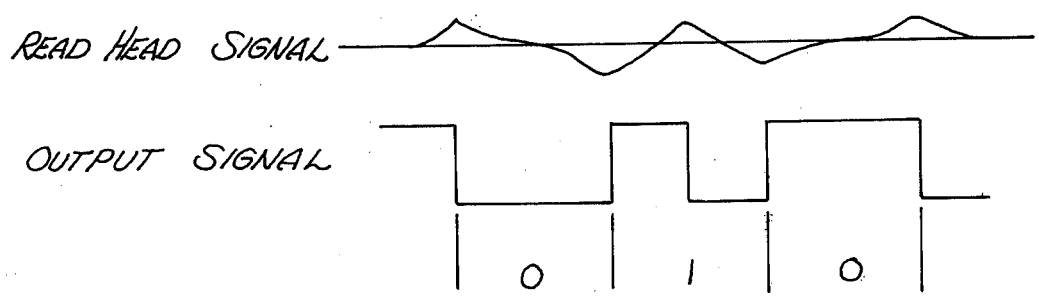
FIG. 5 shows typical wave forms of signals from the read head and the pulse shaper.

The peak detecting portion of the circuit 24 detects when the input signal has reached a maximum or a minimum by, essentially, differentiating the input signal with respect to time, so that when the slope of the input signal goes from positive to negative a positive peak is detected, and when the slope of the input goes from negative to positive a negative peak is detected. The signal generated is thus independent of the amplitude of the input signal. The shaping portion of circuit 24 is utilized to make a decisive "on" or "off" signal at the output. This is clearly shown in the contrast between the read head signal and the output signal in FIG. 5. The output of the peak detecting portion of circuit 24 is shaped by driving amplifier 40' into saturation, either positively or negatively. The binary digit (bit) time intervals from the magnetic stripe are marked off in FIG. 5 by short vertical lines below the output signal and the data to be detected is written as a "1" or "0" between the vertical marks. The data is a "one" if there is an additional flux change during the bit time interval, otherwise the data is "zero". The output signal from circuit 24 is then fed to time discriminator 26. Although the data is marked on the diagram as a "one" or "zero", it must be understood that since the signal at the output of the peak detecting and pulse shaping circuit 24 has not yet been decoded by the discriminator 26, and may be stretched out or compressed in time depending on the speed at which the stripe is passed over the read head, it is not really known at that point what data is represented by such signal.

Figure 6:
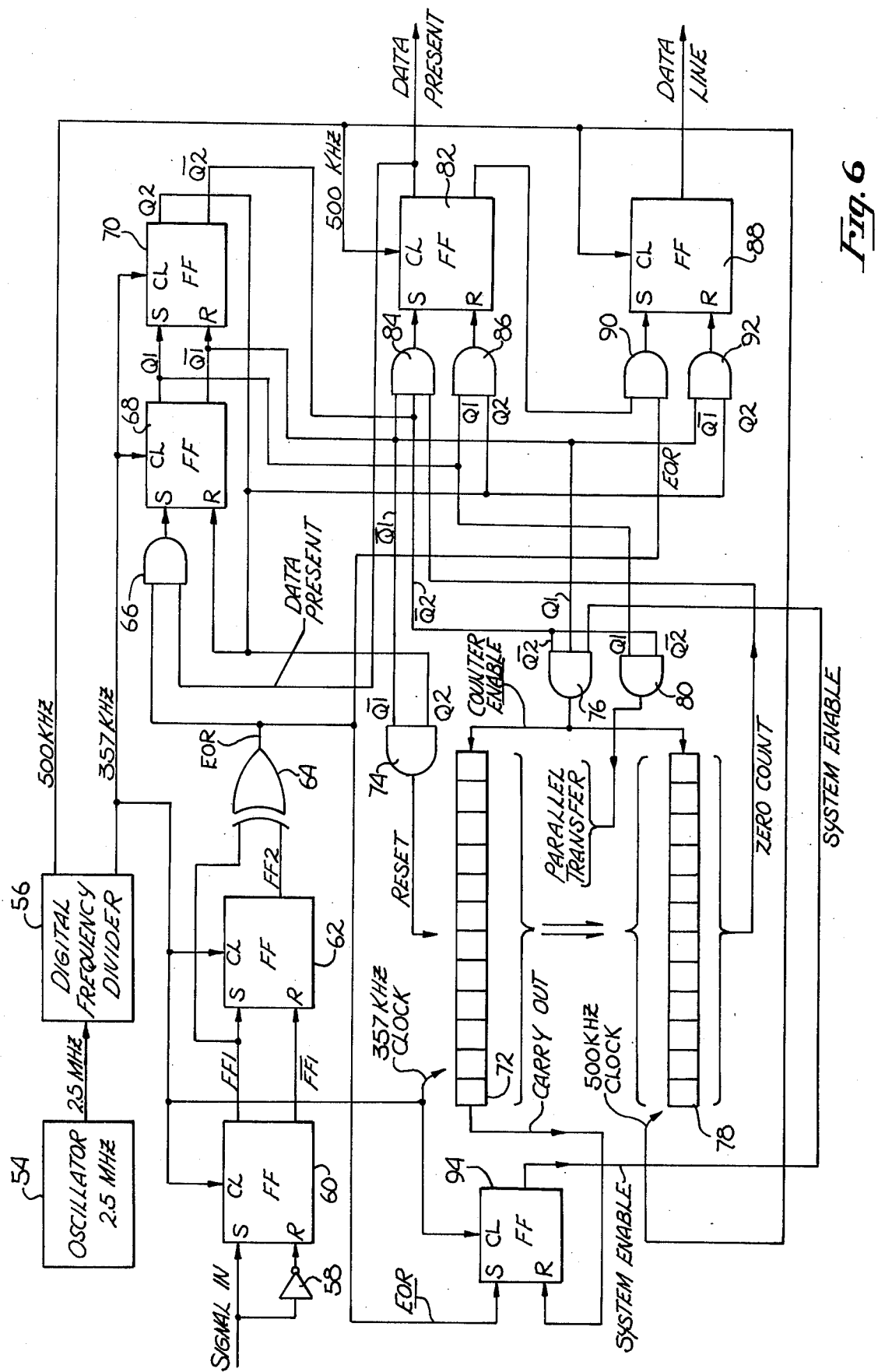
FIG. 6 illustrates in logic diagram form an embodiment of the digital time discriminator and digitizer shown in FIG. 3.

FIG. 6 shows, in logic diagram form, an embodiment of the present invention utilizing a digital time discriminator which receives the output signal from the peak detecting and pulse shaping circuit 24, decodes the information, and converts it into a conventional clocked data form. In FIG. 6, an oscillating circuit 54 generates a signal having a frequency of, for example, 2.5 megahertz which is applied to a digital frequency divider 56 comprising a digital counter circuit which counts the pulses repetitively. The divider 56 provides output signals of 500 kilohertz and 357 kilohertz, a ratio of 7 to 5, which are used as clock signals for the various flip-flop circuits and are used to count two electronic digital counters, as described hereafter.

In the present embodiment, a single pulse synchronized to the 357 kHz clock signal is generated each time that the output signal from the peak detecting and pulse shaping circuit 24, shown as SIGNAL IN, indicates a change of flux from the magnetic stripe 12. Two electronic flip-flop circuits 60 and 62 are clocked by the 357 kHz signal. SIGNAL IN provides the set input to flip-flop 60 and is inverted by an inverter circuit 58 to provide a reset input to flip-flop 60. Whenever SIGNAL IN changes state flip-flop 60 changes state accordingly on the next rise of the 357 kHz signal. Flip-flop 62 follows the state of flip-flop 60 on the subsequent rise of the 357 kHz clock signal, which is approximately 2.80 microseconds later. The outputs of the flip-flops 60 and 62, FF1 and FF2, are applied to an "exclusive or" gate 64 whose output is "true" whenever its two inputs are of different polarity. This output signal, shown as EOR, provides a pulse of 2.8 microseconds duration synchronized to the 357 kHz clock signal immediately following each change of flux detected from the magnetic stripe 12.

Flip-flops 68 and 70, whose outputs are labeled Q1 and Q2, are also clocked by the rise of the 357 kHz clock signal. The "set" input to flip-flop 68 is an "and" gate 66 whose output is "true" whenever there is a change of flux as generated by EOR and a signal, later to be fully described, shown as "DATA PRESENT". The DATA PRESENT signal indicates that the flux change results from the end of a bit time interval from the magnetic stripe 12 and not from a "one" being indicated within the bit time interval from the magnetic stripe 12. When flip-flop 68 is set, flip-flop 70 is set at the following rise of the 357 kHz clock signal. This is followed by the resetting of flip-flop 68 and finally the resetting of flip-flop 70 at the following 357 KHz clock signals. FIG. 7 shows an example of the wave forms for a particular SIGNAL IN sequence.

Shown in FIG. 6 are two digital counters 72 and 78, each of which has a capacity of twelve bits and can accommodate a count of as much as 4,096. The capacity of the counters 72 and 78 may, of course, be extended to any number of bits. The first counter 72 is clocked by the 357 kHz signal. The counter 72 is reset, in parallel, to a count of zero whenever "and" gate 74 is "true", which is when Q2 is true and Q1 is false. This counter 72 is reset at the beginning of each bit time interval measured from the magnetic stripe 12. When both flip-flop 68 and flip-flop 70 are reset, "and" gate 76 makes the signal, shown as COUNTER ENABLE, "true" which allows the counter 72 to count at the 357 kHz rate starting from a count of zero. (A signal, shown as SYSTEM ENABLE, which is described hereafter, is also an input to gate 76 and is normally "true"). Counter 72 continues to count until flip-flop 68 is set indicating the end of that bit time interval from the magnetic stripe 12.

When flip-flop 68 is set, the count in the first counter 72, which is a direct digital measure of time of the preceeding bit time interval from the magnetic stripe 12, is transferred to the second counter 78. This transfer is caused by a signal from "and" gate 80 which controls a set of "and" gates, not shown, which transfer in parallel the contents in counter 72 to the counter 78. The second counter 78 is stepped by the higher 500 kHz clock signal and counts down at this rate starting, at the beginning of the bit time interval, with the count as previously generated by the first counter 72. Since the second counter 78 steps at a higher frequency (a ratio of 7 to 5), and each bit time interval should almost equal its predecessor (except for acceleration or deceleration and recording tolerances), it is seen that the second counter 78 will count down to zero in approximately 5/7 or 0.714 of this bit time interval from the magnetic stripe 12. If there is a change in flux, as signified by signal EOR, before the second counter 78 reaches zero, the data bit from the stripe 12 is a "one"; if the second counter 78 reaches zero before there is a change in flux, the data bit is "zero". The signal EOR following the time that the second counter 78 reaches zero signifies the end of the bit time interval from the magnetic stripe 12. Thus, the data is decoded by comparing the occurrence of voltage pulses after the onset of a bit interval with a preselected portion of the measured time duration of the preceeding set interval. While in this embodiment 0.714 of the preceeding bit time interval has been selected as the optimum for the dynamic range of card velocity, that is the anticipated range of card acceleration/deceleration during a single pass, it is seen that ideally any portion greater than one-half and less than the entire measured time duration of the preceeding bit time interval may be selected for the double frequency phase decoding depending on such anticipated range.

The data from the stripe 12 is converted in the present embodiment to a format employing two signals: (1) DATA PRESENT or data clock and (2) the DATA LINE which transmits the bit during the time DATA PRESENT is true.

As shown in FIG. 6, a flip-flop 82 is used to generate the DATA PRESENT signal. The flip-flop 82 is clocked by the 500 KHz clock signal and is set by an "and" gate 84 whose output is true when second counter 78 reaches zero during the bit time interval. A signal from the second counter 78, shown as ZERO COUNT, indicates that the counter 78 has reached a count of zero and is used to set the flip-flop 82 which generates the DATA PRESENT signal. The DATA PRESENT flip-flop 82 remains set until the end of the bit time interval from the magnetic stripe 12 as is determined from the next following signal EOR. The signal EOR will set flip-flop 68 and when flip-flops 68 and 70 are both true, the DATA PRESENT flip-flop 82 is reset by "and" gate 86. The timing of these signals is shown in FIG. 7.

The DATA LINE signal is generated by flip-flop 88, shown in FIG. 6, which is set only if the data from the magnetic stripe 12 is a "one", that is if there is a flux change, an EOR signal, detected before the second counter 78 reaches zero as indicated by setting of flip-flop 82. Therefore, flip-flop 88, clocked by the 500 KHz clock, is set by an "and" gate 90 which has as its inputs, the EOR signal, indicating a flux change, and the inverse output of flip-flop 82. An EOR signal prior to the counter 78 reaching zero (flip-flop 82 being still reset) thus signifies a "one" (flip-flop 88 being set) from the magnetic stripe 12; otherwise there is a "zero" (flip-flop 88 being reset) from the stripe 12. Flip-flop 88, if set, must remain set during the entire duration that DATA PRESENT is "true". Therefore, it is reset by "and" gate 92 when flip-flop 70 is set but flip-flop 68 has been reset. The timing diagram of these signals is shown in FIG. 7.

Since the present embodiment must be initialized so that the first bit time interval is interpreted as a "zero", that is, so that the first two flux changes are not interpreted as a bit time interval transmitting a "one", flip-flop 94 is provided. When no information is being read by the read head 20, counter 72 will continue to count for a few thousandths of a second until it counts to its capacity (twelve ones or 4,095) and will then emit a CARRY OUT signal. This CARRY OUT signal is used to reset flip-flop 94 which causes the SYSTEM ENABLE signal to go "false", thereby stopping counter 72 from counting (by way of "and" gate 76). Counter 72 is thus left with a count of all zeros. The flip-flop 82 is left set because counter 78 will reach zero before counter 72 reaches all ones. The first flux change from the next magnetic stripe 12 to be read, as shown by an EOR signal, will cause flip-flop 94 to be set and thus enable the counter 72, and will cause flip-flop 82 to be reset. Zeros will be transferred from counter 72 to counter 78 which will immediately cause flip-flop 82 to again be set so that the following or second flux change, an EOR signal, will be interpreted as the end of the bit time interval (by the setting of flip-flop 68) rather than as a "one" from the stripe 12.

Having described the invention, it is obvious that numerous modifications and departures may be made by those skilled in the art but which incorporate the same principles as herein disclosed. For example, the second counter can be replaced by a storage register which holds the count reached by the first counter during the preceding bit time interval. The contents of this storage register can then be compared to the count of the first counter as it proceeds to measure the time duration of the present bit time interval from the stripe. An arithmetic comparator can provide a time signal indicating that the first counter has reached a predetermined, fixed proportion of the preceeding count as stored in the storage register. This timing signal can then be used to identify a flux change from the stripe as being data or a bit interval indicator. Thus the invention is to be construed as being limited only by the spirit and scope of the appended claims.

We claim:

1. Apparatus for decoding digital information read from a magnetic medium in the form of a series of voltage pulses representing magnetic flux changes on said magnetic medium and in which the time incidence of the voltage pulses of a succeeding bit time interval are compared with a preselected amount of the measured time duration of the prior bit time interval to determine the data state of the succeeding bit time interval comprising:

means for receiving the voltage pulses of said prior bit time interval for determining the beginning and end of said prior bit time interval and for measuring the time duration thereof; and comparison means for receiving the voltage pulses of said succeeding bit time interval and for comparing the time incidence of said time voltage pulses of said succeeding bit time interval with a preselected amount of the time duration of said prior bit time interval to determine the data state of said succeeding bit time interval.

2. The apparatus of claim 1 wherein said means for measuring the time duration of said prior bit time interval includes a first digital counter.

3. The apparatus of claim 2 wherein said comparison means includes a second digital counter having a higher counting rate than said first digital counter and coupled to said first digital counter for receiving the count state of said first digital counter at the end of said prior bit time interval.

4. The apparatus of claim 3 wherein said comparison means includes means for determining the onset of said succeeding bit time interval and for causing thereupon said second digital counter to count down from the count state of said first digital counter at said higher counting rate.

5. The apparatus of claim 4 wherein said comparison means includes means for comparing the state of said second digital counter with voltage pulses during said succeeding bit time interval.

6. The apparatus of claim 5 wherein said data state of said succeeding bit time interval is a binary "one" if a voltage pulse occurs before said second digital counter counts down to zero.

7. The apparatus of claim 3 wherein said second digital counter counts at a rate that is approximately forty percent faster than the counting rate of said first digital counter.

8. The apparatus of claim 3 wherein said first and second digital counters count at a rate that is considerably higher than the frequency of said series of voltage pulses.

9. The apparatus of claim 1 wherein said information is encoded on said magnetic medium in a self-clocking format.

10. The apparatus of claim 1 further comprising means for sensing said magnetic flux changes and for providing said voltage pulses in response thereto.

11. Apparatus for decoding digital information read from a magnetic medium in the form of a series of voltage pulses representing magnetic flux changes on said magnetic medium comprising:

first digital counter means, said first counter means counting at a rate that is considerably higher than the frequency rate of said voltage pulses;

means for resetting said first counter means to a count of zero at the beginning of each bit time interval on said magnetic medium, the count reached by said first digital counter prior to being reset being a digital measure of the time duration of the immediately preceding bit time interval;

a second digital counter means;

means for transferring the count established by said first counter means to said second counter means, said second counter means counting downward to a count of zero at a higher counting rate than the rate at which the first counter means counts upwards;

means for detecting when said second digital counter means reaches the count of zero; and means for identifying a voltage pulse from said magnetic medium occurring prior to the time said second counter means reaches a count of zero as a binary "one" from said magnetic medium, and for identifying a voltage pulse from the magnetic medium occurring subsequent to said count of zero as a binary "zero" and as the end of the current bit time interval from said magnetic medium and the beginning of the next bit time interval.

12. The apparatus of claim 11 further providing means for sensing said magnetic flux changes and for providing said voltage pulses in response thereto.

13. The apparatus of claim 11 wherein said information is encoded on said magnetic medium in a self-clocking format.

14. The apparatus of claim 11 wherein said second counter means counts at a rate that is approximately 40 percent faster than said first counter means.

15. Apparatus for decoding digital information read from a magnetic medium in the form of a series of voltage pulses representing magnetic flux changes on said magnetic medium comprising:

digital counter means, said counter means counting at a rate substantially higher than the frequency rate of said voltage pulses;

means for resetting said counter means to a count of zero at the end of each bit time interval, the count reached by said counter means prior to being reset being a digital measure of the time duration of said bit time interval;

means for storing the count reached by said digital counter means prior to being reset;

means for determining when said counter means reaches a fixed proportion of the count reached during the preceding bit time interval; and means for identifying a pulse occurring prior to said counter means reaching said fixed proportion as a binary "one" from said medium, and for identifying a pulse occurring subsequent to said count reaching said fixed proportion as a binary "zero" and as the end of the time interval and the beginning of the next bit time interval.

16. The apparatus of claim 15 further comprising sensing means for transducing the information recorded on said magnetic medium to said voltage pulses representing said digital information.

17. The apparatus of claim 15 wherein said information is encoded on said magnetic medium in a self-clocking format.

* * * * *